United States Patent [19]

Knox et al.

[11] 4,072,902
[45] Feb. 7, 1978

[54] RECEIVER MODULE AND MIXER THEREOF

[75] Inventors: Robert M. Knox, La Grange; Peter P. Toulios, Westchester, both of Ill.

[73] Assignee: Epsilon Lambda Electronics Corporation, Batavia, Ill.

[21] Appl. No.: 740,014

[22] Filed: Nov. 8, 1976

Related U.S. Application Data

[62] Division of Ser. No. 592,065, June 30, 1975, Pat. No. 3,995,238.

[51] Int. Cl.$^2$ ............................................. H04B 1/26
[52] U.S. Cl. .................................................. 325/446
[58] Field of Search ............... 325/442, 445, 446, 449; 333/21 R; 363/157, 158

[56] References Cited

U.S. PATENT DOCUMENTS

| 3,721,903 | 3/1973 | Day | 325/445 |
| 3,854,083 | 12/1974 | Hulderman et al. | 325/446 |

Primary Examiner—Robert L. Griffin
Assistant Examiner—Jin F. Ng
Attorney, Agent, or Firm—Vogel, Dithmar, Stotland, Stratman & Levy

[57] ABSTRACT

A receiver module including a mode launcher, a band pass filter, a local oscillator and a balanced mixer for use in the frequency range 1 GHz to 1,000 GHz, wherein the components are all connected by an insular waveguide transmission line having a conductive image plane, a dielectric waveguide attached to the image plane by a thin film of plastic, the thin film being low loss in character and having a low permittivity compared with that of the dielectric waveguide, the ratio between the thickness of the thin film and the square root of the cross-sectional area of the dielectric waveguide being in the range from about 0.02 to about 1.0.; there also are disclosed signal processing components made of insular waveguide transmission lines including a directional coupler, a symmetrical quadrature hybrid coupler, and a ring resonator filter that can be used as a band rejection or band pass filter either with a single pole or multiple pole, as well as mode launchers for connecting the insular waveguide transmission line to a metal waveguide and a coaxial line.

11 Claims, 24 Drawing Figures

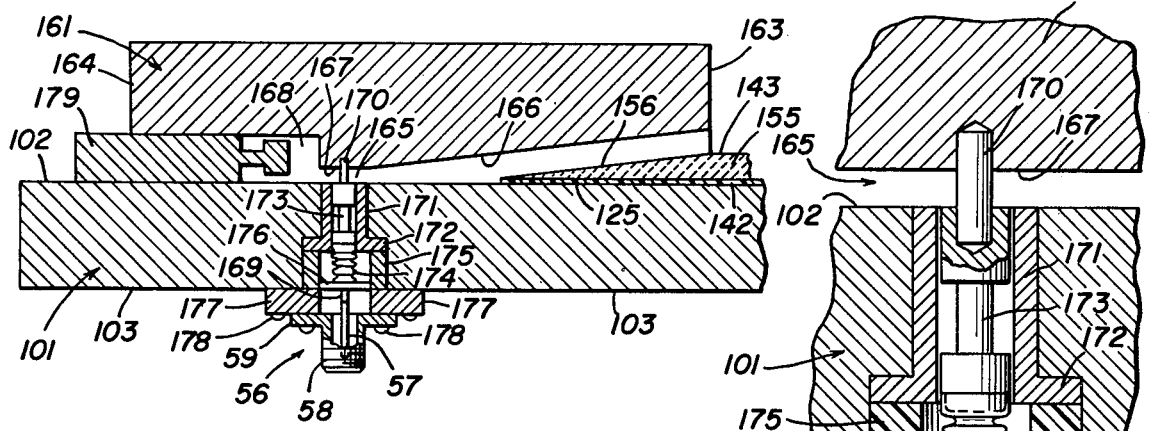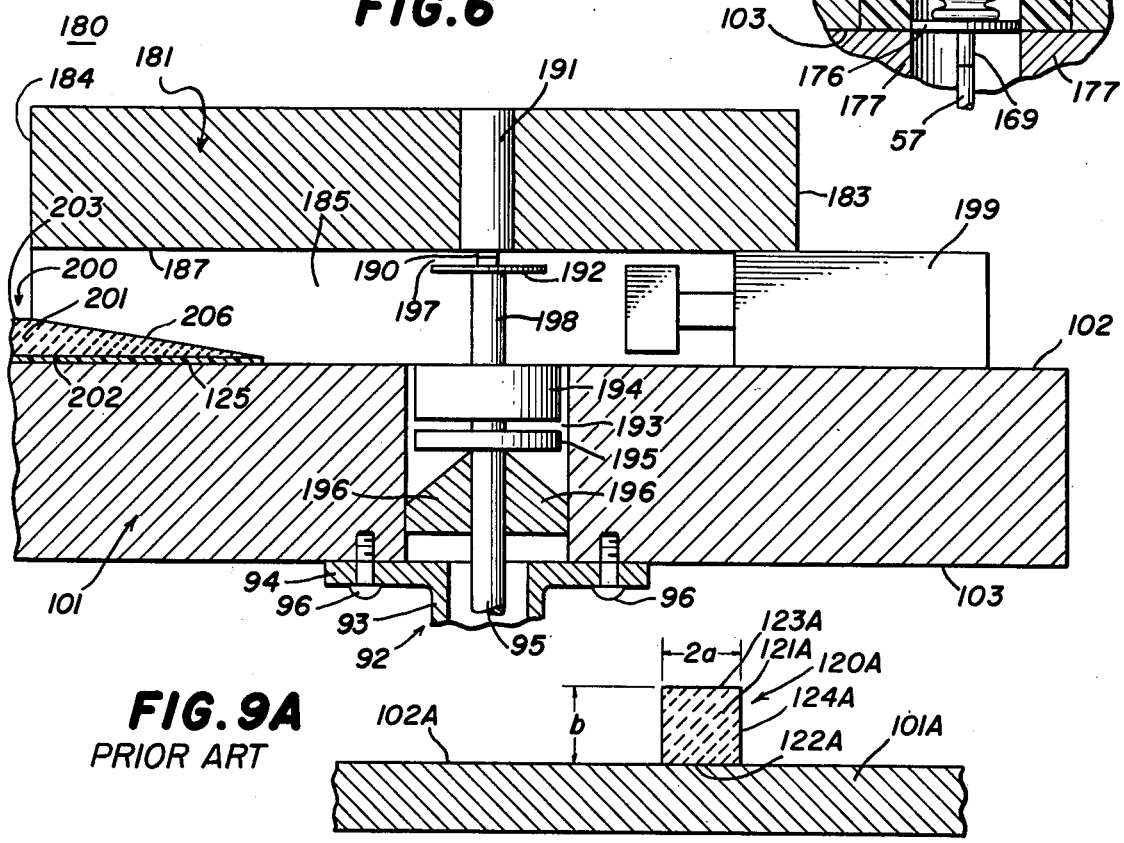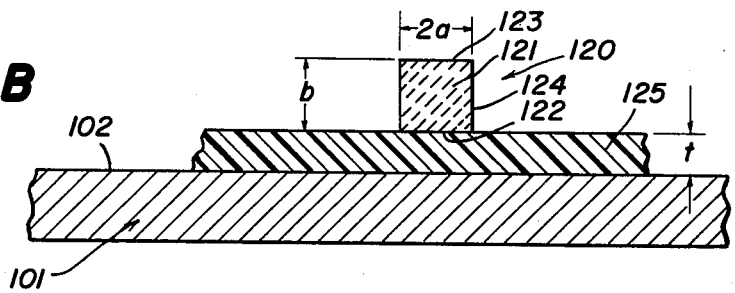

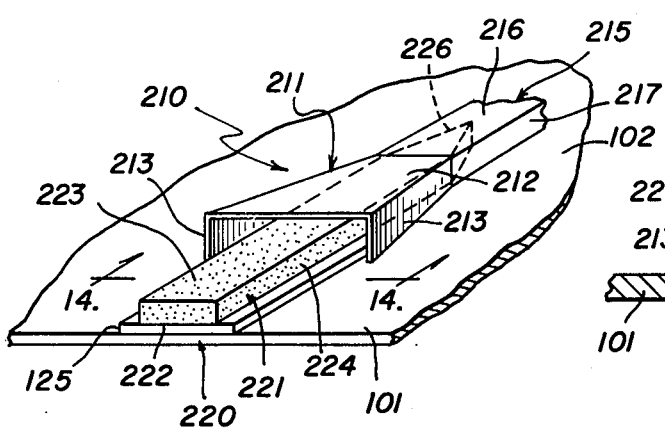
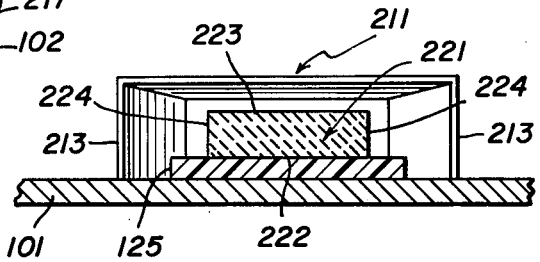
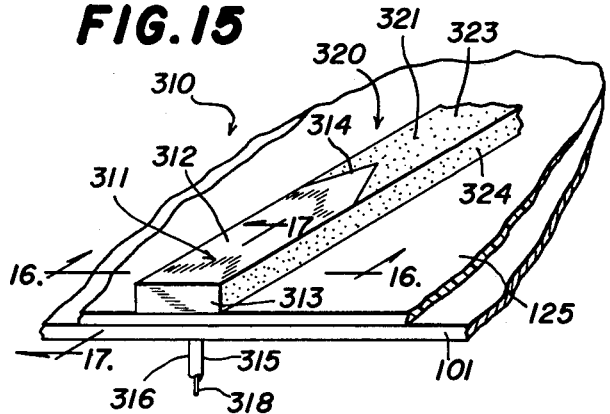
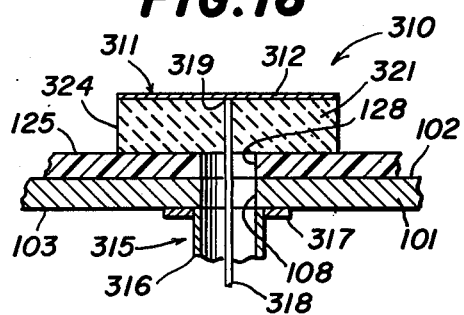
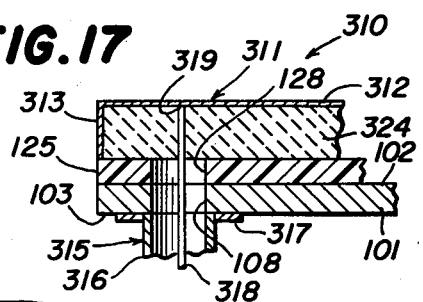
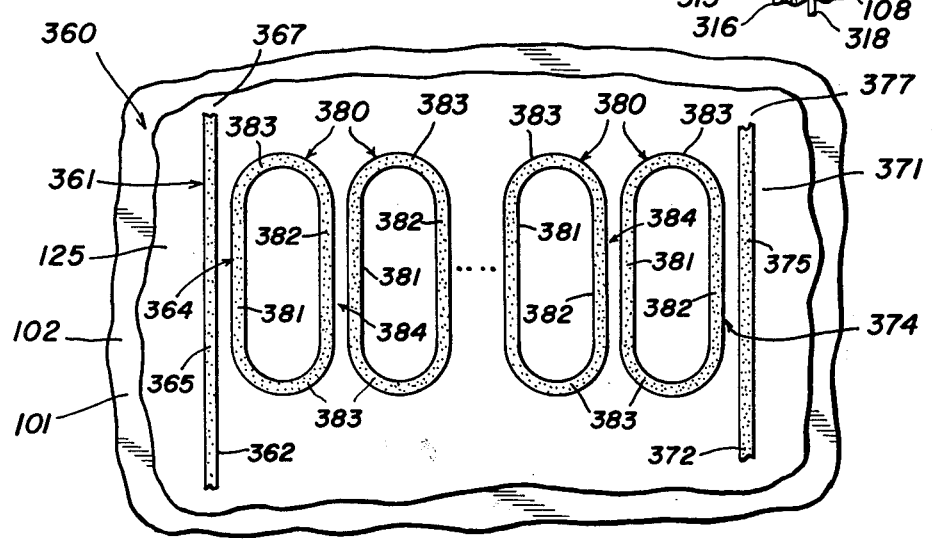

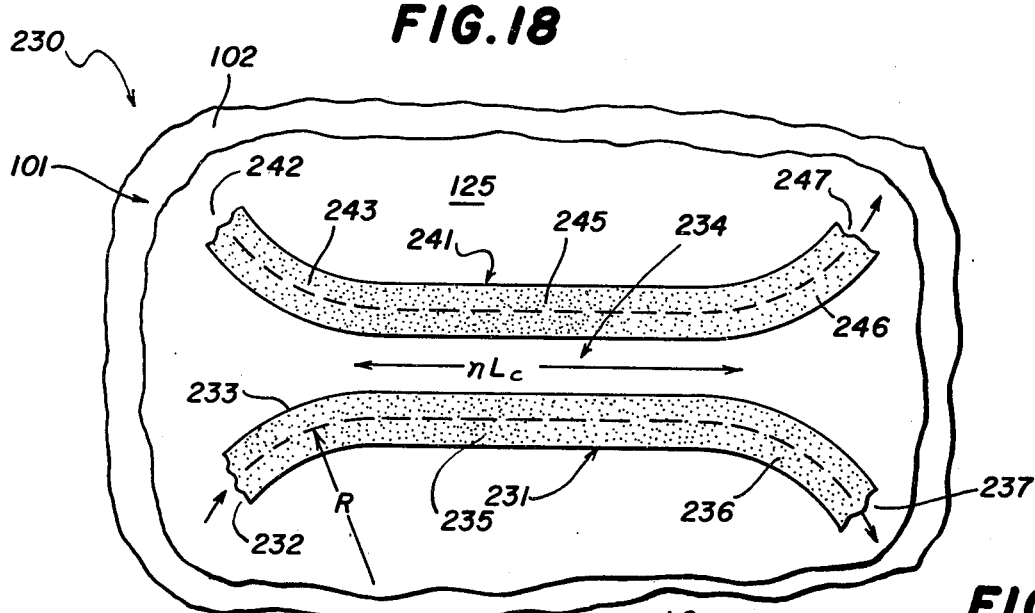
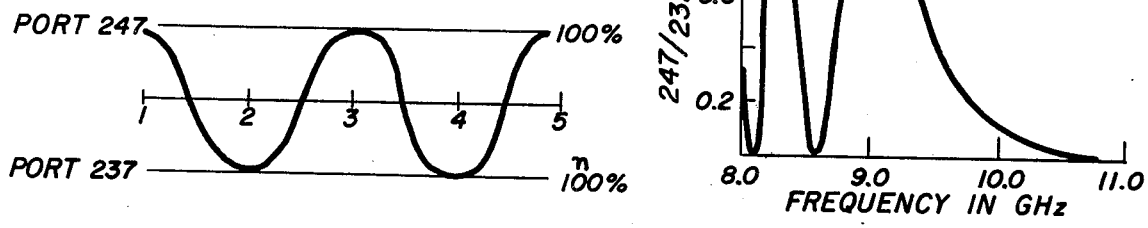
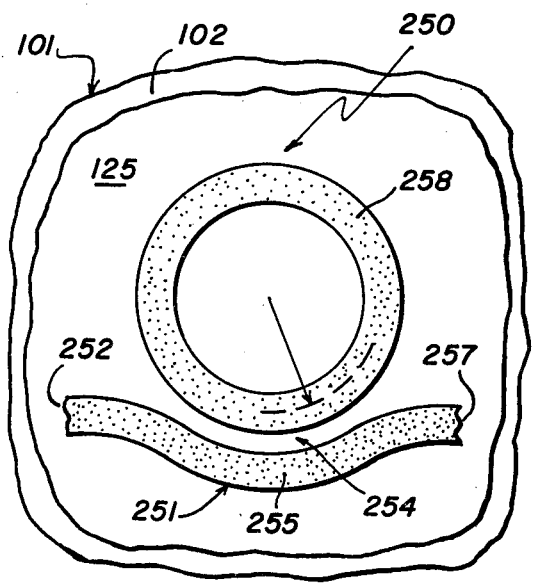
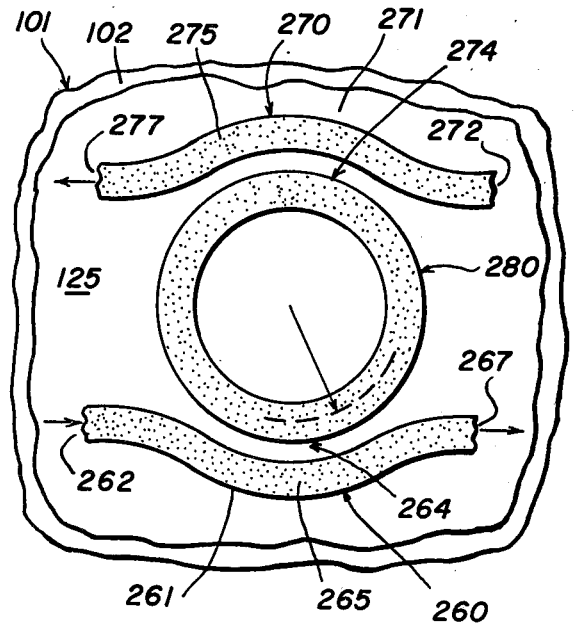

RECEIVER MODULE AND MIXER THEREOF

BACKGROUND OF THE INVENTION

The present invention relates generally to improvements in communications systems and components thereof, and specifically to the provision of an insular waveguide transmission line and components incorporating such a transmission line including passive signal processing components such as couplers, filters, and mode launchers, and active signal processing components such as oscillators and mixers.

Standard practice heretofore in interconnecting components of communication systems in the 1 GHz to 300 GHz frequency range has utilized metallic waveguide, coaxial, microstrip, stripline, slotline or image waveguide transmission lines. The losses encountered in the use of coaxial, microstrip, slotline, stripline and image waveguide transmission lines increase rapidly as the frequency increases, and as a consequence, at about 10 GHz and above the losses encountered in such transmission lines during propogation of electromagnetic energy are substantial, rendering the system uneconomical. Metallic waveguide and coaxial transmission lines also are not readily used as parts of integrated circuits, i.e., these transmission lines do not have an integrable geometry.

Image waveguide transmission lines consist of a dielectric waveguide mounted upon a conductive image plane. It has been found impracticable in practice to maintain manufacturing tolerances so as to prevent formation of gaps between the dielectric waveguide and the conductive image plane. Even very small gaps between the dielectric waveguides and the conductive image plane have a large effect on the dispersion characteristics, i.e., guide wavelength, of the image waveguide transmission line.

Standard practice at frequencies well above 1,000 GHz including the optical range, has been to utilize bundles of fibers or very thin slabs of dielectric material on a mechanical support. These systems cannot be readily fabricated to form integrated circuits of passive and active circuit elements.

SUMMARY OF THE INVENTION

The present invention provides an improved communications system and components thereof, and specifically an insular waveguide transmission line for interconnecting both passive and active circuit elements in communication circuitry so as to provide an integrated module.

This is accomplished in the present invention, and it is an object of the present invention to accomplish these desired results, by providing an insular waveguide transmission line for use in the frequency range of about 1 GHz to about 1,000 GHz comprising a conductive image plane, an elongated high permittivity dielectric waveguide of finite cross section adjacent to the conductive image plane, and a thin film of synthetic organic resin disposed between and secured to both the conductive image plane and the dielectric waveguide and extending laterally thereof, the thin film being low loss in character and having a low permittivity compared with that of the dielectric waveguide, the ratio between the thickness of the thin film and the square root of the cross-sectional area of the dielectric waveguide being in the range from about 0.02 to about 1.0.

In connection with the foregoing object, it is another object of the invention to provide an insular waveguide transmission line of the type set forth, wherein the permittivity of the dielectric waveguide is at least 4 and the loss tangent thereof is less than 0.001, and the thin film has a permittivity less than about 3 and a loss tangent less than about 0.001, the ratio between the permittivity of the dielectric waveguide and the permittivity of the thin film being 2:1 or greater to provide good guidability.

Another object of the invention is to provide a directional coupler utilizing the insular waveguide transmission line of the present invention, the coupler including first and second lengths of dielectric waveguide spaced from each other to provide a coupling region therebetween, the first length of waveguide having an inlet port at one end of the coupling region and an outlet port at the other end of the coupling region, the second length of waveguide having a second outlet port at the one end of the coupling region, all of the energy injected into the inlet port being coupled from the first length of waveguide across the coupling region to the second length of waveguide and out the second outlet port when the coupling region has a length equivalent to an odd number of coupling lengths and all of the energy injected into the inlet port being transmitted through the coupling region to the first outlet port when the coupling region has a length equivalent to an even number of coupling lengths.

Yet another object of the invention is to provide a band reject ring resonator filter utilizing the insular waveguide transmission line of the present invention, the filter including a first length of dielectric waveguide arranged in a closed ring form, a second length of dielectric waveguide disposed adjacent to and spaced from the first length of waveguide to provide a coupling region therebetween, the second length of waveguide having an inlet port at one end of the coupling region and an outlet port at the other end of the coupling region, the filter rejecting and blocking passage of energy from the inlet port to the outlet port when the mean periphery of the first length of waveguide is an integral multiple of the guide wavelength of the energy in the first length of waveguide, the filter permitting passage of energy from the inlet ports to the outlet port when the mean periphery of the first length of waveguide is other than an integral multiple of the guide wavelength of the energy in the first length of waveguide.

Another object of the invention is to provide a band pass ring resonator filter utilizing the insular waveguide transmission line of the present invention, and including a first length of waveguide arranged in a closed ring form, a second length of waveguide disposed adjacent to and spaced from the first length of waveguide to provide a first coupling region therebetween, a third length of waveguide disposed adjacent to and spaced from the first length of waveguide on the side thereof opposite the second length of waveguide to provide a second coupling region therebetween, the second length of waveguide having an inlet port at one end of the first coupling region and a first outlet port at the other end of the first coupling region and the third length of waveguide having a second outlet port at the end of the second coupling region adjacent to the inlet port and a termination at the end of the second coupling region adjacent to the first outlet port, the band pass filter passing energy injected into the inlet port from the second length of waveguide through the first length of waveguide and the third length of waveguide and out of the second outlet port when the mean periphery of the first length of waveguide is an integral multiple of the guide wavelength of the energy in the first length of waveguide, the band pass filter passing energy injected into the inlet port from the second length of waveguide and out of the first outlet port when the mean periphery of the first length of waveguide is other than an integral multiple of the guide wavelength of the energy in the first length of waveguide.

In connection with the foregoing object, it is another object of the invention to provide a band pass resonator filter of the type set forth wherein a plurality of first lengths of dielectric wave guide are provided each arranged in closed ring form and in general longitudinal relation to each other with adjacent sections of adjacent rings being spaced apart to provide coupling regions therebetween.

Yet another object of the invention is to provide a mode launcher for interconnecting the insular waveguide of the present invention and a metal waveguide, including a launcher housing having one end coupled to the dielectric waveguide and structure at the other end for coupling to one end of a metal waveguide, the launcher housing including a first region providing impedance reduction for the mode of electromagnetic energy transmitted by the metal waveguide, a second region transforming the mode of energy transmitted by the metal waveguide to the mode of energy transmitted by the dielectric waveguide, and a third region providing the proper aperture for the mode of electromagnetic energy transmitted by the dielectric waveguide.

Still another object of the invention is to provide a mode launcher for interconnecting an insular waveguide of the present invention and a coaxial transmission line comprising a metal plate disposed on a surface of the dielectric waveguide disposed away from the conductive image plane and on the outer free end of the dielectric waveguide, the outer conductor of the coaxial transmission line having one end thereof secured to the surface of the conductive image plane of the insular waveguide transmission line opposite the thin film of synthetic organic resin disposed between the dielectric waveguide and the conductive image plane and registering with aligned openings in the conductive image plane and the thin film, the adjacent end of the inner conductor of the coaxial transmission line extending through an opening in the dielectric waveguide and being coupled to the metal plate and located on odd multiple of a guide wavelength from the metal plate on the outer end of the dielectric waveguide.

A further object of the invention is to provide active elements in a communication system having connections made thereto using the insular waveguide transmission line of the present invention, such active elements including diodes to provide an oscillator and a mixer.

A still further object of the invention is to provide a communication equipment module incorporating therein passive elements and active elements all interconnected to form an integrated circuit utilizing the insular waveguide transmission line of the present invention.

Further features of the invention pertain to the particular arrangement of the parts of the insular waveguide transmission line and the passive and active elements interconnected thereby, whereby the above outlined and additional operating features thereof are attained.

The invention, both as to its organization and method of opertion, together with further features and advantages thereof will best be understood with reference to the following specification taken in connection with the accompanying drawings.

BRIEF DESCRIPTION OF THE DRAWINGS

FIG. 4 is an enlarged view in vertical section with certain parts broken away along the line 4—4 in FIG. 2 and illustrating one of the two cavities of the balanced mixer forming a part of the receiver module of FIG. 2;

FIG. 5 is a further enlarged fragmentary view showing the mount of the diode in the balanced mixer cavity of FIG. 4;

FIG. 6 is an enlarged view in vertical section with certain portions broken away along the line 6—6 in FIG. 2 and illustrating the local oscillator forming a part of the receiver module of FIG. 2;

FIG. 9A is a schematic representation of an image waveguide transmission line forming a part of the prior art herein;

FIG. 9B is a schematic diagram of the insular waveguide transmission line forming a part of the present invention;

FIG. 13 is a perspective view with certain parts broken away of a mode launcher for interconnecting the image waveguide transmission line of the present invention to a metal waveguide;

FIG. 14 is a view in vertical section along the line 14—14 of FIG. 13;

FIG. 15 is a perspective view with certain portions broken away of a mode launcher for interconnecting an insular waveguide transmission line to a coaxial transmission line;

FIG. 16 is a view in vertical section along the line 16—16 of FIG. 15;

FIG. 17 is a view in longitudinal section along the line 17—17 of FIG. 15;

FIG. 18 is a plan view with certain parts broken away of another form of directional coupler made in accordance with and embodying the principles of the present invention;

FIG. 18A is a graph showing the relationship between the energy transferred to the two outlet ports of the coupler of FIG. 18 and the length of the coupling region thereon;

FIG. 18B is a graph showing the relationship between the energy transferred to the two outlet ports of the coupler of FIG. 18 for various frequencies given a fixed length of the coupling region;

FIG. 19 is a plan view with certain parts broken away illustrating a band reject ring resonator filter made in accordance with and embodying the principles of the present invention;

FIG. 20 is a plan view with certain parts broken away illustrating a second embodiment of a band pass ring resonator filter made in accordance with and embodying the principles of the present invention; and FIG. 21 is a plan view with certain parts broken away illustrating a third embodiment of a band pass ring resonator filter utilizing a plurality of rings and made in accordance with and embodying the principles of the present invention.

DESCRIPTION OF THE PREFERRED EMBODIMENTS

Figure 1:
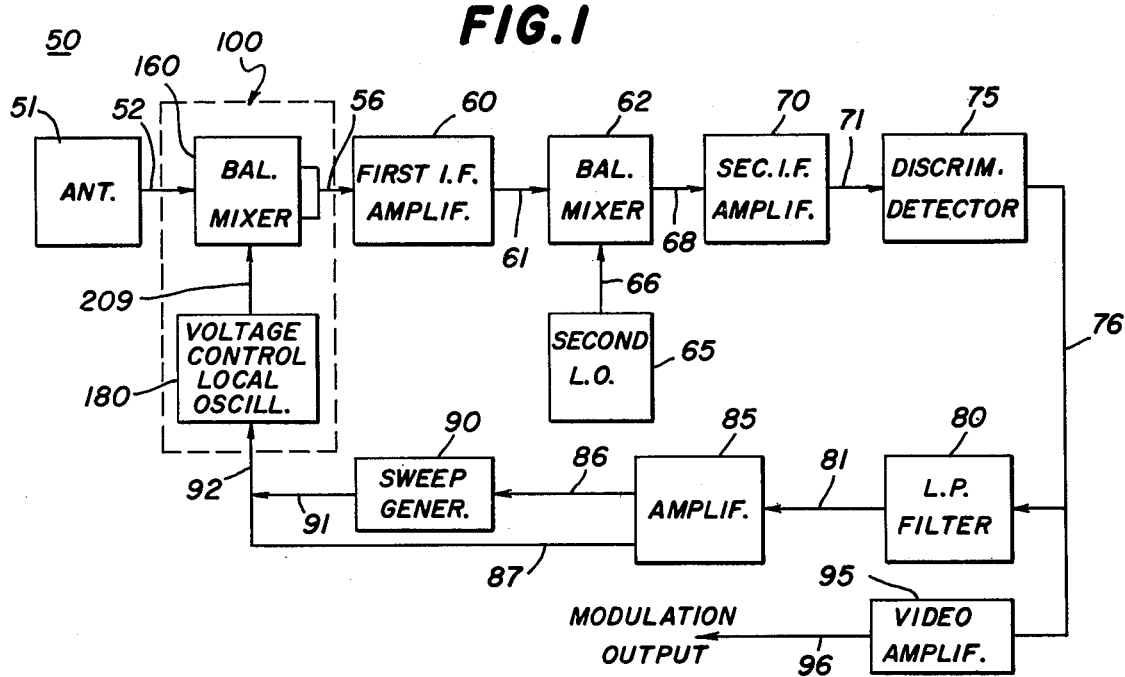
FIG. 1 is a diagram in block form of a receiver forming a part of a 60 GHz communications system useful for short range communication, and incorporating therein the present invention.

Referring to FIG. 1 of the drawings, there is illustrated a block diagram of a receiver 50 forming part of a communication system designed to operate at essentially 60 GHz. As illustrated, the receiver 50 is provided with an antenna 51 which is connected by a metal waveguide 52 to a receiver module generally designated by the numeral 100, the receiver module 100 being enclosed by a dashed line in FIG. 1 of the drawings. The metal waveguide 52 more particularly is connected to the input of a balanced mixer 100 which has applied thereto as a second input a 59.3 GHz signal from a local oscillator 180 through an insular waveguide transmission line section 209.

The output from the receiver module 100 is a first IF frequency of 500 MHz (with a 100 MHz bandwidth) through a coaxial transmission line 56 that is coupled to the input of a first IF amplifier 60. The output of the first IF amplifier 60 is in turn coupled by a transmission line 61 to the input of a second balanced mixer 62 which has as a second input thereto the output of a second local oscillator 65 along a transmission line 66. The output of the balanced mixer 62 is a second IF frequency of 60 MHz (with a 20MHz bandwidth) which is conveyed by a transmission line 68 to a second IF amplifier 70. The output from the second IF amplifier 70 is fed by the transmission line 71 to the input of a discriminator-detector 75 which has as its output any intelligence that was impressed upon the transmitter signal received by the antenna 51 together with any signals due to the carrier frequency or local oscillator deviations. The deviation signals from the discriminator-detector 75 are useful as an input to an automatic frequency control loop to adjust the frequency output of the first local oscillator 180. More specifically, the transmission line 76 is connected to the input of a low pass filter 80 forming a part of an automatic frequency control circuit, the filter 80 having its output connected via transmission line 81 to the input of an amplifier 85. One output from the amplifier 85 is connected via the transmission lines 87 and 92 as a bias input to the diode forming a part of the local oscillator 180 (as will be described more fully hereinafter.) If necessary, a sweep voltage is applied to the local oscillator 180 to permit a search and lock of the receiver to the transmitter frequency being received by the antenna 51, and to this end a second output from the amplifier 85 is coupled by a transmission line 86 to the input of a sweep generator 90. The output of the sweep generator 90 is connected via the transmission lines 91 and 92 to provide a bias for the diode forming a part of the local oscillator 180. Finally, the transmission line 76 carrying the output from the discriminator-detector 75 is also connected as the input to a video amplifier 95 which has its output connected by a transmission line 96 as the intelligence modulation output from the receiver 60.

Referring to FIGS. 2 to 6 of the drawings, the details of the construction and operation of the receiver module 100 will be described. As illustrated, the receiver modular 100 is an integrated circuit with all the parts thereof mounted upon a base plate 101 essentially rectangular in shape and having a top surface 102, a bottom surface 103, and two end surfaces 104. The base plate 101 is made of a material which has both a high electrical conductivity and a high heat conductivity so as to form an electrical connection between certain parts and so as to provide a heat sink for the heat generated during the operation of the receiver module 100.

Figure 2:
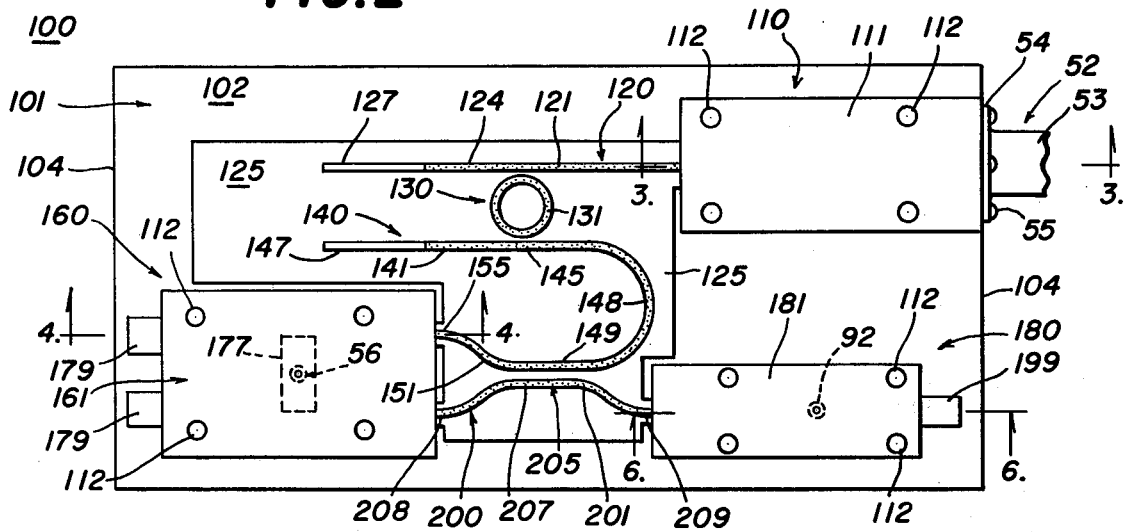
FIG. 2 is a plan view with certain portions broken away of a receiver module forming part of the communication receiver of FIG. 1.

The input to the receiver module 100 is from the metal waveguide 52 that is connected at its input end to the antenna 51 as described above, and has its output end connected to the receiver module 100 at the upper right hand corner as viewed in FIG. 2. The waveguide 52 includes a rectangular body 53 that is hollow to provide a guide channel, the end of the body 53 adjacent to the base plate 100 having a flange 54 with openings therein receiving screws 55 firmly to connect the waveguide 52 to the base plate 101.

Figure 3:
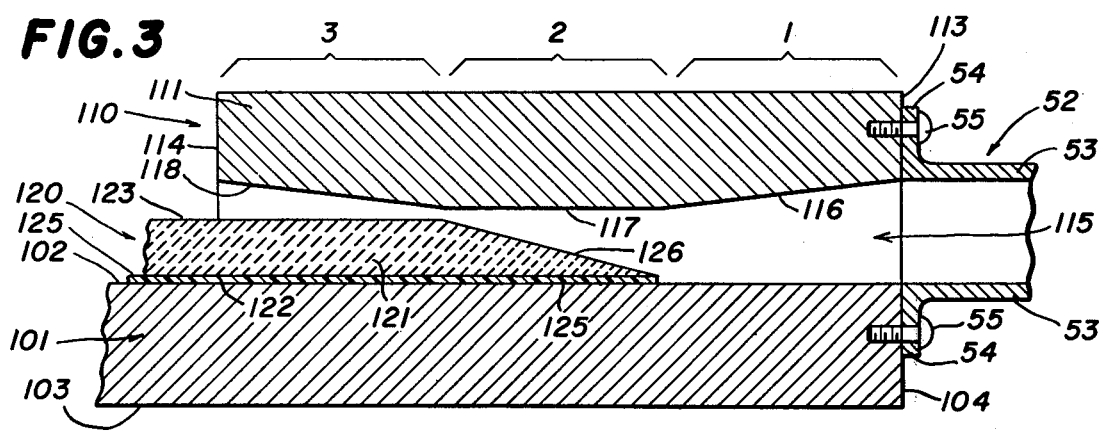
FIG. 3 is a view in vertical section along the line 3—3 of FIG. 2 and illustrating the construction of a mode launcher forming a part of the receiver module of FIG. 2.

The output from the waveguide 53 is coupled to a mode launcher 110, further details of which are illustrated in FIG. 3 of the drawings. The launcher 110 includes a housing 111 that is generally rectangular in form and is mounted upon the base plate 101 in electrical and heat conducting contact therewith, the housing being connected to the base plate 101 by four bolts 112. The waveguide 52 is also bolted to the housing 111 as is illustrated in FIG. 3 of the drawing to the right thereof. More specifically, the housing 111 has end surfaces 113 and 114, the waveguide 52 being connected to the end surface 113.

Arranged centrally through the housing 111 longitudinally thereof is an opening which in cooperation with the top surface of the base plate 101 forms an energy guiding channel 115. The width of the channel 115 is equal to that of the interior of the metal waveguide 52 and the height of the channel 115 varies from end to end thereof, the channel 115 being divided into essentially three regions as indicated at the top of FIG. 3 by the brackets and numbers associated therewith. Region 1 is disposed to the right in FIG. 3 and the surface of the housing 111 associated therewith is designated by the numeral 116 and slopes downwardly toward the opposed top surface 102 of the base plate 101 from the metal waveguide 52 to the left. In region 2, the surface 117 is essentially parallel to the top surface 102 of the base plate 101, while in region 3 the surface 118 slopes upwardly and away from the top surface 102 of the base plate 101 from right to left, all for reasons to be discussed more fully hereinafter.

The mode launcher 110 serves to transfer the electromagnetic energy from the metal waveguide 52 to an insular waveguide transmission line 120 made in accordance with and embodying the principles of the present invention. The insular waveguide transmission line 120 includes a conductive image plane provided by the base plate 101, a dielectric waveguide 121 and a thin film 125 of synthetic organic plastic resin.

As illustrated, the dielectric waveguide 120 is formed of a ceramic, namely alumina, is square in cross section and includes a bottom 122, a top 123 parallel to the bottom 122 and two longitudinal sides 124 parallel to each other and disposed normal to the bottom 122 and the top 123. In order to facilitate the transformation of the mode of electromagnetic energy transmitted by the metal waveguide 52 to the mode of electromagnetic energy transmitted by the dielectric waveguide 121, the end of the dielectric waveguide 121 adjacent to the metal waveguide 52 is tapered as at 126 toward the waveguide 52 in a direction away from the opposed surface 117 on the launcher housing 111. The thin plastic film 125 is disposed between and intimately secured to both the top surface 102 of the base plate 101 and the bottom surface 122 of the dielectric waveguide 121.

The mode launcher 110 functions to interconnect the metal waveguide 52 to the insular waveguide 121 to provide an efficient transfer of energy therebetween. Region 1 in the mode launcher 110 disposed to the right in FIG. 3 provides an impedance reduction for the $TE_{10}$ mode propagated along the metal waveguide 52 and into the right hand end of the launcher 110. Region 2 then serves to transform the $TE_{10}$ mode propagated through the metal waveguide 52 to the $E_{11}{}^y$ mode propagated through the dielectric waveguide 121. Region 3 in the launcher 110 serves to provide the proper aperture for the $E_{11}{}^y$ mode as it is transmitted by the dielectric waveguide 121 away from the launcher 110 and to the left as viewed in FIG. 3.

Referring again to FIG. 2 of the drawings, the output from the mode launcher 110 appears on the insular waveguide transmission line 120 and is coupled thereby to the band pass ring resonator filter 130. The filter 130 is comprised of a section of the transmission line 120, a termination 127 for the lefthand end of the dielectric waveguide 121, a closed ring 131 of dielectric waveguide and a section of a transmission line 140 disposed below the ring 131.

More specifically, the dielectric waveguide 121 extends to the left from the mode launcher 110 and terminates at the left end thereof in the termination 127 which comprises a film of synthetic organic resin extending along the top 123 of the dielectric waveguide 121 for a distance of about seven guide wavelengths, a minimum of five guide wavelengths being required. The film of the termination 127 is more specifically formed of a polyester resin formed by the condensation of ethylene glycol and terepthalic acid, such as that sold under the trademark "Mylar," the film having thereon a coating of lossy Nichrome metal.

The ring 131 is more specifically circular in shape and is formed of a ceramic, namely alumina, and has the same form and composition and cross-sectional shape as the dielectric waveguide 121. The mean periphery or circumference of the ring 131 has a length equal to at least 10 guide wavelengths in order to minimize the radiation of electromagnetic energy from the ring 131 during operation.

The transmission line 140 is constructed like and is essentially identical in composition and arrangement to the transmission line 120 described above. More specifically, the transmission line 140 includes a dielectric waveguide 141 having a bottom 142 and a top 143 essentially parallel to each other, the bottom 142 being firmly secured to the plastic film 125. The longitudinal axis of a portion of the dielectric waveguide 141 is disposed parallel to the longitudinal axis of the dielectric waveguide 121 and the left hand end of the dielectric waveguide 141 is provided with a termination 147 in the form of a film which is constructed and arranged as is the film of the termination 127 described above.

The dielectric waveguides 121 and 131 have portions thereof disposed adjacent to each other and spaced apart to provide a first coupling region; the dielectric waveguides 131 and 141 also have portions disposed adjacent to each other but spaced apart to provide a second coupling region therebetween. In the operation of the filter 130, the righthand end of the dielectric waveguide 121 adjacent to the launcher 110 serves as an inlet port, while the portion of the dielectric waveguide 141 extending to the right of the portion 145 serves as an outlet port for the filter 130. When the mean circumference of the dielectric waveguide 131 is an integral multiple of the guide wavelength of the energy in the waveguide 131, the filter 130 passes the energy from the dielectric waveguide 121 across the first coupling region to the ring dielectric waveguide 131 and then across the second coupling region to the dielectric waveguide 141, and specifically the section 145 thereof.

When the mean circumference of the dielectric waveguide 131 is other than an integral multiple of the guide wavelength of the energy in waveguide 131, the filter 130 passes the energy from the dielectric waveguide 121 to the termination 127.

Figure 7:
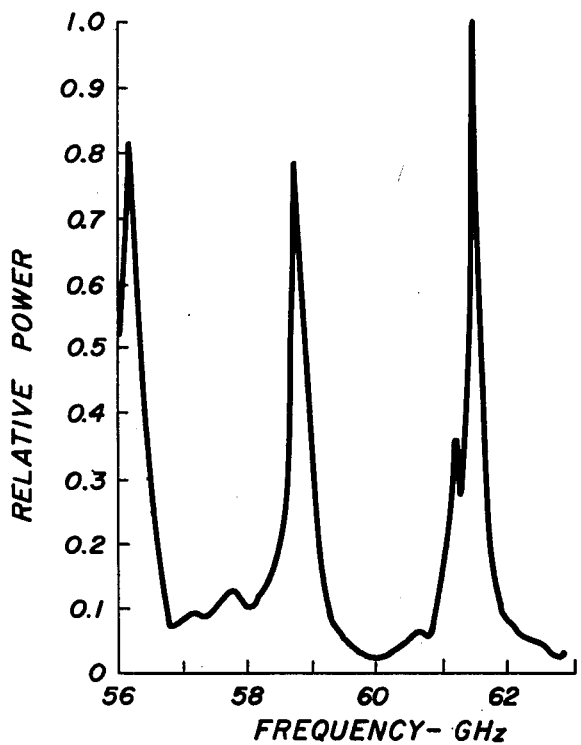
FIG. 7 is a graph plotting the frequency response of the insular waveguide band pass ring resonator filter forming a part of the present invention.

The frequency response of the ring filter 130 is illustrated in FIG. 7 of the drawings over the frequency range of from 56 GHz to 63 GHz. These measurements were made by coupling into the dielectric waveguides beyond the filter 130 with a sweep oscillator connected to the input. The signal passband of the receiver module 100 is the response at 58.8 GHz. From this graph it will be seen that the filter 130 primarily acts to provide rejection of the image input frequency band occurring at 59.8 GHz.

Energy passed by the filter 130 is conducted by the dielectric waveguide 141 from the section 145 to the right and around a curved section 148 to a second rectilinear section 149. The rectilinear section 149 is in turn coupled by an S-shaped section 151 to a third rectilinear section 155 that provides one of the inputs to the balanced mixer 160. Referring to FIGS. 2, 4 and 5, the details of construction of the balanced mixer 160 will be described. There is provided a mixer housing 161 that is essentially rectangular in shape and rests upon the top surface 102 the base plate 101 and is firmly secured thereto in both electrical and heat conducting relationship by four of the bolts 112. The housing 161 has end surfaces 163 on the right and 164 on the left that are connected by two openings 165 extending therethrough and providing two mixer cavities; the two mixer cavities are identical in construction and operation; and therefore only one will be described in detail.

Each opening 165 is rectangular in cross section in a direction normal to the waveguide section 155 in the case of the upper opening 165 and in a direction longitudinally of the waveguide section 155 has the configuration illustrated in FIG. 4. More specifically, the opening 165 has the top thereof sloping downwardly along a surface 166 and merges with a surface 167 disposed parallel to the top surface 102 of the base plate 101. The surface 167 joins a slot 168 which is provided in the left hand end of the housing 161. From FIG. 4 it will be seen that the dielectric waveguide section 155 extends into the opening 165 and the upper surface thereof is tapered downwardly as at 156, the surfaces 156 and 166 being essentially parallel to each other and spaced apart as illustrated.

Mounted in the housing 161 in an opening in the parallel surface 167 is a diode 170, and more specifically a Schottky-Barrier mixer diode 170, having the longitudinal axis thereof disposed normal to the top surface 102 of the base plate 101. Disposed in the base plate 101 is a diode mount which includes an anodized aluminum sleeve 171 having the upper end flush with the surface 102 and having at the lower end an outwardly extending annular flange 172. Disposed within the opening in the sleeve 171 is a low pass coaxial filter assembly 173 which rests at its lower end upon a spring bellows 174 and which has at its upper end an opening receiving the lower end of the diode 170. Disposed below the flange 172 is a "Teflon" sleeve 175 which surrounds the bellows spring 174 and also slidably receives therein a circular plate 176 which is secured to one upper end of a U-shaped connector 169. Surrounding the opening in the "Teflon" sleeve 175 and holding the parts in position is a metal spacer 177 secured to the bottom surface 103 of the base plate 101 as by screws 178. The diode mount assembly described firmly seats the diode 170 in operative position within the opening 165 so as to receive the energy transmitted thereto by the dielectric waveguide section 155. In order to provide impedance matching in the balanced mixer, a tuning short 179 is provided in the slot 168 and is shiftable toward and away from the mixer diode 170 to accomplish impedance matching.

As explained above, the balanced mixer 160 includes two mixing cavities or openings 165, one of which has been described above with respect to FIGS. 4 and 5. A second mixing cavity or opening is like that described and is provided directly below the upper opening 165 as viewed in FIG. 2, the longitudinal axes of the two openings 165 being parallel and having all of the other components thereof of like construction and arrangement. The outputs of the two mixer cavities are connected by the U-shaped connector 169 which in turn is connected to the center conductor 57 of the coaxial transmission line 56. The outer conductor 58 of the coaxial transmission line 56 has its flange 59 secured to the spacer 177 by screws 178. As illustrated, the second mixer cavity also has a tuning short 179 to the left as illustrated in FIG. 2, and has extending thereinto from the right as viewed in FIG. 2 a dielectric waveguide transmission line 200 which has the same construction and arrangement as the dielectric waveguide transmission line 120 described above, and includes a dielectric waveguide 201 having a rectilinear waveguide section 207 which forms a part of a coupler 205 and is offset from two waveguide sections 208 and 209.

The balanced mixer 160 as illustrated has an input thereto from the two waveguide sections 155 and 208 from a symmetrical quadrature hybrid coupler 205 as will be described more fully hereinafter. Referring specifically to the waveguide section 155 in FIG. 4, the tapered surface 156 thereon provides for coupling of the electromagnetic energy from the waveguide 155 to the associated mixer opening or cavity 165 and thus to the mixer diode 170. The provision of the parallel surfaces 156 and 166 provides impedance increase for the $E_{11}^y$ mode of transmission by the dielectric waveguide 155 together with a transformation of the $E_{11}^y$ mode to the $TE_{10}$ mode and impedance transformation to that required by the mixer diode 170. The mixer housing 161 provides an RF ground for the top contact of the mixer diode 160, and the IF frequency from the mixer diode 170 is transmitted from the lower contact thereof through the filter assembly 173, the spring 174, the plate 176 and the U-shaped connector 169 to the inner coaxial conductor 57. The filter assembly 173 prevents transmission of the frequencies other than the IF frequency to the conductor 57. It will be understood that the characteristic impedance of the filter assembly 173 alternates high and low approximately every quarter wavelength at the RF frequency and the local oscillator frequency, so as to present a very low RF impedance at the base of the mixer diode 170. The bellows spring 174 provides spring tension so that good electrical contact is made with both contacts of the mixer diode 170. The output of the two mixer diodes 170 and the balanced mixer 160 are symmetrically connected to the common coaxial transmission line 56.

Further input to the balance mixer 160 is from a local oscillator 180 which is of the voltage controlled type, the details of construction of which are illustrated in FIGS. 2 and 6 of the drawings. The oscillator 180 includes a housing 181, preferably of aluminum, which is generally rectangular in shape and is in electrical and heat conducting contact with the top surface 102 of the base plate 101 and is held in such relationship by four bolts 112. The housing 182 has opposed parallel end surfaces 183 and 184 which are connected by an opening 185 extending through the housing 182, the opening 185 being rectangular in cross section and having an upper surface 187 parallel to the top surface 102 of the base plate 101. Mounted within the opening 185 is an IMPATT diode 190, the diode 190 being more specifically mounted upon a post 191 secured in the housing 181. Disposed in vertical alignment with the post 191 is a rod 198 which carries at its upper end a flange 192 which in cooperation with the surface 187 provides a resonant radial transmission line cavity. The rod 198 also carries a pair of longitudinally spaced apart cylindrical portions 194 and 195 that are disposed in an opening in the base plate 101 and cooperate to form an RF trap so as to prevent transmission of RF energy from the opening 185 through the opening in the base plate 101. Also surrounding the rod 198 below the RF trap and serving further to prevent transmission of RF energy along the rod 198 is a tapered section of lossy ferrite material 196 that further serves to isolate the DC circuit providing bias through the coaxial connector 92 to the diode 190 from the RF fields developed in the local oscillator 180.

The frequency of operation of the local oscillator 180 can be changed and controlled in two ways. There is provided a RF tuning short 199 extending into the right hand end of the opening 185, the tuning short 199 being shiftable and adjustable toward and away from the diode 190. The tuning short 199 provides excellent course tuning for the frequency of operation of the oscillator 180. The second method of tuning the oscillator 180 is by way of the variation of the bias current applied through the coaxial transmission line 92, and specifically the inner conductor 95 thereof to the lower end of the rod 198. As illustrated, the coaxial transmission line 92 includes a hollow outer conductor 93 provided with a flange 94 secured to the bottom surface 103 of the base plate 101 by screws 96. Referring to FIG. 1, it will be seen that the coaxial conductor 92 is connected to the output of the amplifier 85 and the sweep generator 90 from which the bias voltages for the diode 190 are obtained. The bias voltages accomplish a fine tuning of the frequency of operation of the oscillator 180 and further can be used to compensate for carrier drift in the electromagnetic radiation being received, and by use of the sweep generator 90 to seek out an electromagnetic carrier wave and to keep the receiver 50 tuned thereto by use of the automatic frequency control circuit described above with respect to FIG. 1.

The right hand end of the dielectric waveguide 201 forming a part of the transmission line 200 extends into the left hand end of the opening 185 and has the upper surface thereof tapered downwardly as at 206 away from the surface 187 on the housing 181. As described above with respect to the transmission line 120, this configuration serves to provide a mode launcher, including impedance matching and mode conversion of the $TE_{10}$ mode of electromagnetic energy generated by the local oscillator 180 to the $E_{11}{}^y$ mode of electromagnetic energy transmitted by the dielectric waveguide 201.

Figure 8:
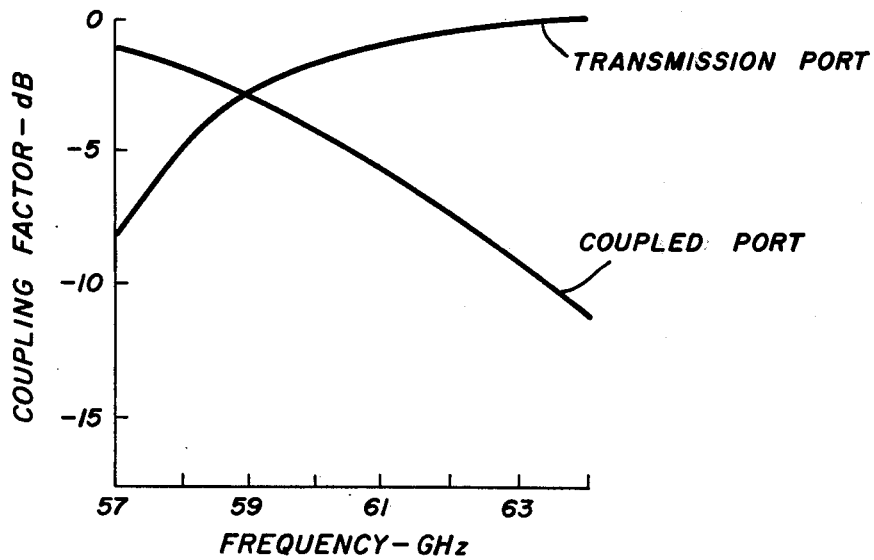
FIG. 8 is a graph plotting the coupling characteristics of the quadrature hybrid directional coupler forming a part of the present invention.

The dielectric waveguide 201 extends outwardly from the local oscillator 180 to the left as section 209 and guides the local oscillator RF energy to the coupler 205 which is of the symmetrical quadrature hybrid type. More specifically, the coupler 205 receives the incoming RF energy from the filter 130 and the RF energy from the local oscillator 180 and feeds those energies to the mixer 160 in a balanced configuration. The incoming RF energy appears on the dielectric waveguide section 149 in the coupler 205, and a portion thereof is coupled to the dielectric waveguide 201 and particularly the section 207 accompanied by a 90° phase shift thereof, thereby to provide as the input to the lowermost or second mixing cavity of the mixer 160 a combination of the local oscillator RF energy and the phase shifted incoming RF energy. Simultaneously a portion of the local oscillator RF energy on the dielectric waveguide 201 is coupled from the section 207 thereof in the coupler 205 to the waveguide section 149, accompanied by a 90° phase shift thereof, thereby to provide as the input to the upper or first mixing cavity of the mixer 160 a combination of the phase shifted local oscillator RF energy and the incoming RF energy. The coupler 205 therefor provides a balanced configuration for the mixer 160. Referring to FIG. 8 of the drawings there is shown a graph wherein is plotted the typical coupling characteristics of the coupler 205. It will be seen that the coupling factor at 58.8 GHz was 3dB and the directivity is 25dB.

Referring to FIGS. 9A, 9B, 10, 11, and 12, further details of the construction and operation of the insular waveguide transmission line of the present invention will be described. It will be understood that each of the transmission lines 120, 130, 140 and 200 described above is constructed and arranged as described herein. For comparison there is illustrated in FIG. 9A of the drawings a prior art image waveguide transmission line 120A which includes a conductive image plane in the form of a plate 101A and a dielectric waveguide 121A resting upon and in intimate contact with the upper surface 102A of the base plate 101A. The dielectric waveguide 121A includes a bottom 122A, a top 123A parallel to the bottom 122A and a pair of sides 124A parallel to each other and perpendicular to both the bottom 122A and the top 123A. The width of the dielectric waveguide 121A is indicated as being $2a$ and the height is illustrated as being $b$, the width and the height being equal as illustrated, whereby the dielectric waveguide 121A is square in cross section.

Referring to FIG. 9B, the insular waveguide transmission line 120 of the present invention also includes the base plate 101 and the dielectric waveguide 121 corresponding respectively to the base plate 101A and the dielectric waveguide 121A of the image waveguide of FIG. 9A, but there is disposed between the base plate 101 and the dielectric waveguide 121 a plastic film 125, the thickness of the plastic film 125 being designated as $t$.

The base plate 101 must be both a good electrical conductor so as to provide necessary electrical interconnection where required, and also a good heat conductor to provide a heat sink for receiving the heat generated during operation of the electrical system wherein the transmission line 120 is used. Suitable examples of such a material are the metals, the preferred metal being aluminum.

The dielectric waveguide 121 is formed of a low loss ceramic and must possess a relatively high permittivity, i.e., the permittivity of the dielectric waveguide 121 should be 4 or greater, and the ceramic also must have a low loss tangent, i.e., the loss tangent should be less than about 0.001. Examples of fired ceramics useful in the present invention to form the dielectric waveguide 121 are alumina which has a permittivity of about 10 and a loss tangent of about 0.001, titanium dioxide having a permittivity of about 100 and a loss tangent of about 0.0005; the barium titanates having a permittivity in the range of from about 300 to about 2000 and having a loss tangent in the range from about 0.0005 to about 0.001; and fused quartz having a permittivity of about 4 and a loss tangent of about 0.0001, and ferrite materials having a permittivity from about 12 to about 16 and a loss tangent from about 0.0006 to about 0.001. Single crystal ceramics may also be utilized including sapphire having a permittivity of 11 and a loss tangent of from about 0.00005 to about 0.0001; silicon having a permittivity of 12 and a loss tangent of about 0.0002; and gallium arsenide having a permittivity of about 11 and a loss tangent of about 0.0005. The dielectric waveguide 121 can also be formed of a synthetic organic plastic filled with one of the ceramic materials specified above. In such a case the plastic material may be polystyrene or a tetrafluoroethylene polymer such as that sold under the trademark "Teflon." Such waveguide will have a permittivity from about 4 to about 25 and a loss factor of about 0.001. Although the dielectric waveguide 121 has been illustrated as being square in cross section, it will be understood that other shapes may be used including rectangular, hemi-spherical, trapezoidal, triangular, hexagonal, and the like. In general, any configuration may be utilized which provides a flat bottom 122 useful for attachment to the plastic film 125.

The film 125 is formed of a suitable synthetic organic resin, the resin having a low permittivity, i.e., less than 3, and being low loss of character and having a loss tangent less than about 0.001. The film 125 extends laterally beyond the sides 124 of the dielectric waveguide 121 and is intimately connected to both the base plate 101 and the dielectric waveguide 121 throughout the contacting and adjacent surfaces thereof. The film 125 is preferably formed of a polyethylene resin or a polypropylene resin or a tetrafluoroethylene resin, such as that sold under the trademark "Teflon."

In accordance with the present invention, the ratio between the thickness of the film 125 and the thickness of the dielectric waveguide 121, i.e., the ratio of $t/b$, is in the range from about 0.02 to about 1.0.

When the waveguide 121 has a cross section other than square, the height of the waveguide, i.e., $b$, is equivalent to the square root of the cross sectional area of the dielectric waveguide 121, i.e., $\sqrt{A}$, and in that case the ratio of $t/\sqrt{A}$ is also in the range from about 0.02 to about 1.0. The provision of the plastic film 125 having a thickness $t$ such that the $t/b$ ratio is at least 0.02 eliminates one of the problems encountered in use of the image waveguide 121A. More particularly, it was difficult to maintain manufacturing tolerances of the parts so as to provide no gaps between the bottom 122A of the dielectric waveguide 121A and the top surface 102A of the base plate 101A. Such gaps adversely affected the performance of the image waveguide. The film 125 also provides a more convenient manner of attaching the dielectric waveguide 121 to the base plate 101, the image waveguide 121A having been attached with an adhesive which generally added more loss to the system then with the use of the plastic film 125. Recapitulating, the use of a plastic film having a thickness $t$ so that the $t/b$ ratio is 0.02 eliminates the extreme sensitivity at the very small gaps of the guide wavelength or propagation velocity encountered in the image waveguide transmission in 120A. If the $t/b$ ratio is greater than 1.0, there is essentially no guide wavelength dependence which means that the image plane provides no suppression of the $E_{11}^x$ mode, i.e., the horizontally polarized counterpart of the desired $E_{11}^y$ mode. By limiting the maximum thickness of the film 125, some propagation velocity or guide wavelength dependence is retained because field imaging occurs and thus a boundary condition is established for suppression of the horizontal field of the $E_{11}^x$ mode.

In order to attach the thin plastic film 125 to both the base plate 101 and the associated dielectric waveguide, the base plate 101 is heated to soften the plastic film until the surface liquifies, after which the parts are cooled to room temperature. When the film 125 is made of polyethylene resin, it must be heated to a temperature of about 180° F. Polypropylene resins must be heated to a higher temperature, and tetrafluoroethylene resins must be heated to even higher temperatures.

The insular waveguide transmission line 120 is useful in the range from about 1 GHz to about 1,000 GHz. At frequencies below 1 GHz, the dimensions of the parts are too large in cross section and the guide wavelength is too large for practical integrated circuit use. At frequencies above 1,000 GHz, the dimensions of the parts are too small for reasonable dimensional tolerance control during manufacture. Also most suitable dielectric materials are too high in attenuation at such frequencies.

As stated above, the permittivity of the plastic film 125 should be low compared to that of the dielectric waveguide 121. Such a relationship insures good guidability of the electromagnetic energy by the waveguide 121, and further insures that corners can be turned within a reasonably small radius in the dielectric waveguide 121 without excess radiation loss. The minimum value of the ratio between the permittivity of the dielectric waveguide 121 and the permittivity of the plastic film 125 is about 2.0:1.

If the dielectric waveguide 121 has a rectangular cross section, it is preferred that the ratio of its width to its height, i.e., the ratio of the dimensions $2a/b$ is in the range from about 0.5 to about 2. This insures optimum operation of the insular waveguide transmission line 120. A square cross section gives the highest percent of operating bandwidth for single mode propagation.

In a preferred form of the insular waveguide transmission line 120 for use at frequencies of about 60 GHZ, the parts have the following dimensions: $2a$ equals 0.040 inch; $b$ equals 0.040 inch; the dielectric waveguide 121 is formed of alumina having a permitivity of 9.8 and a loss factor of 0.0001; the plastic film 125 has a thickness of 0.010 inch and is formed of polyethylene having a permittivity of 2.25 and a loss factor of 0.0002; the $t/b$ ratio equals 0.25; and the ratios between the permittivities in 4.36.

Figure 10:
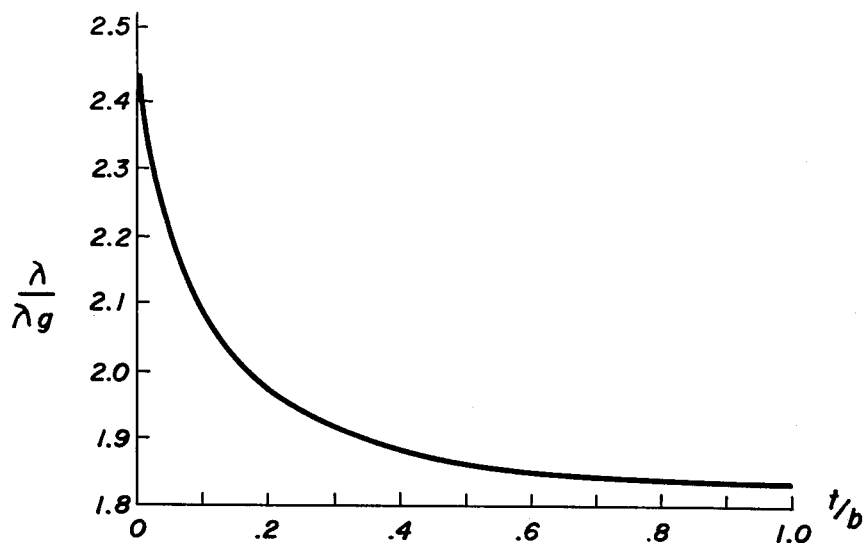
FIG. 10 is a graph plotting the guide wavelength ratio versus the ratio between the thickness of the plastic film between the dielectric waveguide and the conductive image plane to the height of the dielectric waveguide above the thin film.
Figure 11:
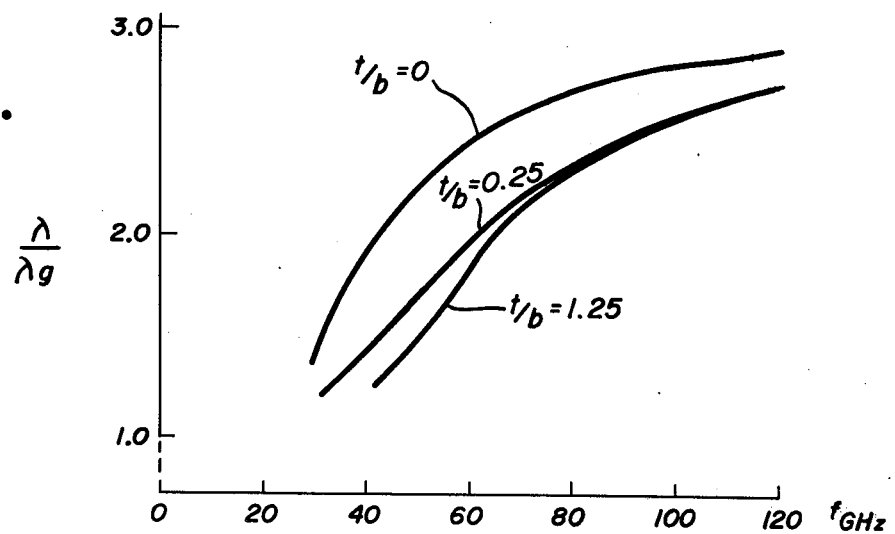
FIG. 11 is a graph plotting the guide wavelength ratio versus the dispersion characteristics of the insular waveguide of the present invention for various $t/b$ ratios.

The dispersion characteristics of the dominant $E_{11}^y$ mode of propagation for typical waveguide dimensions are given in FIGS. 10 and 11. Referring specifically to FIG. 10, it is seen that for a $t/b$ ratio of 0, i.e., in the case of an image waveguide as illustrated in FIG. 9A, the wavelength ratio or velocity ratio is approximately 2.5. As the $t/b$ ratio increases from 0 toward 0.02, the wavelength ratio changes very rapidly, while at $t/b$ ratios above 0.25 there is little change in the wavelength ratio. Therefore, the preferred $t/b$ ratio is 0.25. The use of such a $t/b$ ratio reduces the requirement for close dimensional tolerances when fabricating circuits using the insular waveguide transmission line 120.

Referring to FIG. 11, dispersion characteristics are plotted for three different $t/b$ ratios in the frequency range from about 30 GHz to 120 GHz, the values of these ratios being 0, 0.25 and 1.25. The dispersion characteristics again indicate that there is very little change in the characteristics in going from a value of the ratio of 0.25 to one of 1.25, while there is substantial change in going from a $t/b$ ratio equal to 0 to a $t/b$ ratio equal to 0.25.

Figure 12:
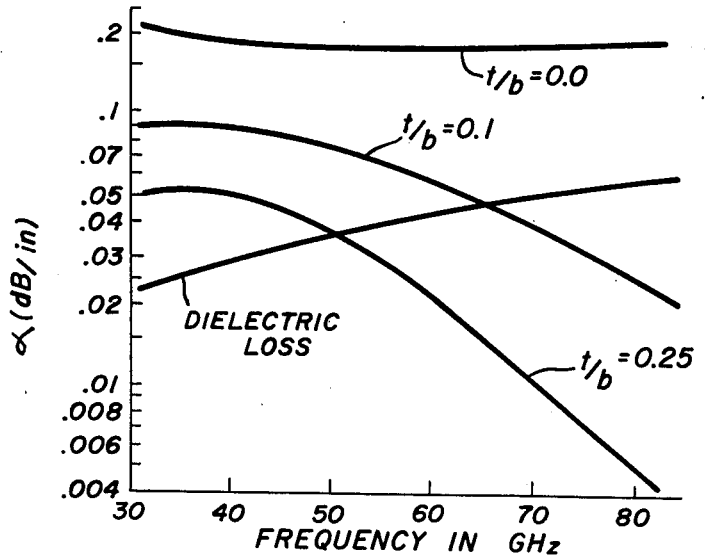
FIG. 12 is a graph plotting the conductor and dielectric losses in insular waveguides and image waveguides over a range of frequency from about 30 GHz to 80 GHz.

There is shown in FIG. 12 of the drawings a plot of conductor and dielectric losses in image waveguide and insular waveguide transmission lines, plots being shown for $t/b$ ratios of 0.0 (image waveguide) 0.1 and 0.25 (insular waveguides). It will be seen that conductor losses in the insular waveguides are much lower than those for the image waveguide 120A, i.e., $t/b$ equals 0.0, especially for frequencies above 40 GHz. At 60 GHz, which is the design frequency of the receiver 50 in FIG. 1, the insular waveguide conductor loss for $t/b$ equals 0.25 is approximately a full order of magnitude lower than that of an image waveguide, i.e., $t/b$ equals 0.0. It also is shown that above 50 GHz dielectric losses begin to exceed conductor losses in an insular waveguide wherein the $t/b$ ratio equals 0.25, whereas conductor losses are higher than dielectric losses for frequencies up to at least 80 GHz in the case of an image waveguide, i.e., $t/b$ ratio equals 0.

Referring to FIGS. 13 and 14 of the drawings, there is illustrated a second preferred embodiment of a mode launcher 210 made in accordance with and embodying the principles of the present invention. The mode launcher 210 is useful in interconnecting and coupling electromagnetic energy between a metal waveguide wherein the principle mode of propagation is the $TE_{10}$ mode and a dielectric waveguide wherein the principal mode of propagation is the $E_{11}^y$ mode. The mode launcher 210 more particularly interconnects a metal waveguide 215 formed by the top surface 112 of the base plate 101 operating as the bottom wall, and a U-shaped metal piece providing a top wall 216 and two parallel side walls 217 having the lower edges in electrical contact with and firmly secured to the base plate 101. The insular waveguide transmission line illustrated in FIGS. 13 and 14 is designated by the numeral 210 and includes a dielectric waveguide 221 having a bottom 222, a top 223 and a side 224, the bottom 222 being secured to the upper surface of a plastic film 125 which in turn has the lower surface secured to the top surface 102 of the base plate 101, thus firmly to mount the dielectric waveguide 221 on the base plate 101. The end of the dielectric waveguide 221 disposed to the right in FIG. 13 is tapered as at 226 and extends into the metal waveguide 215. A launcher housing 212 is provided that connects to the left-hand end of the metal waveguide 215 as viewed in FIG. 13 and includes a top wall 212 and two side walls 213. The top wall 212 extends upwardly with respect to the plane of the base plate surface 102 and also flares outwardly to the left. The side walls 213 diverge away from each other from right to left and also at the upper edge diverging upwardly away from the base plate 101 from right to left.

The mode launcher 210 of FIGS. 13 and 14 operates in essentially the same fashion as does the mode launcher 110. More specifically, the launcher serves first to provide an impedance reduction for the $TE_{10}$ mode in the metal waveguide 215, and also provides a second region transforming the $TE_{10}$ mode in the metal waveguide 215 to the $E_{11}{}^y$ mode of the dielectric waveguide 221, these two regions being combined in the dielectric taper section 226, and includes a third region providing the proper aperture for the $E_{11}{}^y$ mode for energy moving into the dielectric waveguide 221.

There is illustrated in FIGS. 15 to 17 of the drawings a mode launcher 310 suitable for interconnecting a coaxial transmission line and an insular waveguide transmission line. The coaxial line is designated by the numeral 315 and includes an outer conductor 316 and an inner conductor 318. The outer conductor 316 has an outwardly extending flange 317 on the outer end thereof which is suitably secured to the bottom surface 103 of the associated base plate 101. Concentric with the opening in the outer conductor 316 are an opening 108 in the base plate 101 and an opening 128 in the plastic film 125. The insular wave guide transmission line in FIGS. 15-17 is generally designated by the numeral 320 and includes a dielectric waveguide 321 having a top 323 and two parallel sides 324. The mode launcher 310 includes a housing 311 in the form of a metallic film deposited on portions of the surface of the dielectric waveguide 321. More specifically, a top film 312 is provided adjacent to the end of the waveguide 321 coupled to the coaxial line 315; the free end of the waveguide 321 also has a metal film 313 thereon that is in contact with the metal film 312. The metal film 312 extends along the dielectric waveguide 321 for 4 guide wavelengths and terminates in a tapered section 314 of an additional four guide wavelengths. The inner conductor 318 of the coaxial line 315 extends upwardly through the openings 108 and 128 and through an opening in the dielectric waveguide 321 and into contact with the top film 312, the inner conductor 318 being mechanically and electrically secured to the film 312. The outer end 319 of the inner conductor 318 contacts the top film 312 at a point that is an odd integral multiple of a one-quarter guide wavelength from the end film 313.

The mode launcher 310 serves efficiently to transfer electromagnetic energy between the coaxial transmission line 315 and the insular waveguide transmission line 320. More specifically, the mode launcher 310 transforms the TEM mode transmitted by the coaxial transmission line 315, to the $E_{11}{}^y$ mode of the dielectric waveguide 321 and suppresses radiation of higher order modes near the center conductor 318 of the coaxial transmission line 315.

Referring to FIG. 18 of the drawings there is shown a directional coupler 230 made in accordance with and embodying the principles of the present invention. As illustrated, the coupler 230 is formed of two lengths of insular waveguide transmission line which incorporate therein the base plate 101 having the top surface 102 carrying the plastic film 125. There is provided a first dielectric waveguide 231 which has an inlet port 232 disposed at the lower left and communicating with a curved section 233 of the waveguide which in turn connects with a coupling section 235. The coupling section 235 is rectilinear and connects at its right-hand end with a second curved section 236 which terminates in an outlet port 237. A second dielectric waveguide 241 is provided having a termination 242 at the left-hand end thereof, which termination may be of the type described above in FIG. 2 and designated by the numerals 127 and 147. The termination 242 connects to the first curved section 243 that in turn connects to a second coupling section 245 that is rectilinear in shape. The right-hand end of the coupling section 245 is connected to a second curved section 246 that terminates in a second outlet port 247.

The two coupling sections 235 and 245 have therebetween a coupling region 234, the longitudinal axes of the coupling sections 235 and 245 being arranged essentially parallel with the coupling sections spaced apart a predetermined distance. The spacing between the coupling sections 235 and 245 is related to the transverse width of the dielectric waveguides 231 and 241. More specifically, the ratio between the spacing and the transverse width is in the range from about 0.1 to about 0.8. The length of the coupling sections 235 and 245 are multiples $n$ of the coupling length $L_c$, the coupling length being the minimum length of the coupling sections 235 and 245 over which the energy injected into the inlet port 232 shifts completely from the first dielectric waveguide 231 to the second dielectric waveguide 241 and out of the second outlet port 247, wherein $n$ is 0 or an integer. When the coupling region 234 has a length equivalent to an odd number of coupling lengths, all of the energy injected into the inlet port 232 will be coupled from the first dielectric waveguide 231 to the second dielectric waveguide 241 and out of the second outlet port 247. When the length of the coupling region 234 is an even number of coupling lengths, all of the energy injected into the inlet port 232 is transmitted through the coupling region and to the first outlet port 237. On the other hand, when the coupling region 234 is other than an integral multiple of the coupling length, there will be a division of the energy transmitted from the inlet port 232 among the outlet ports 237 and 247. This is illustrated in FIG. 18A of the drawings wherein the plot shows the precentage of the energy injected that will be delivered to each of the outlet ports 237 and 247 dependent upon the length of the coupling region 234. FIG. 18B illustrates the relation between the transfer of energy from the inlet port 232 to the outlet ports 237 and 247 when the frequency of the energy is changed.

There is illustrated in FIG. 19 of the drawings an insular waveguide band reject ring resonator filter generally designated by the numeral 250. Forming a part of the filter 250 is the base plate 101 carrying on the top surface 102 thereof the plastic film 125, the plastic film 125 being secured to the surface 102 throughout the contacting areas thereof. Secured to and mounted on the top surface of the film 125 is a dielectric waveguide 251 which has the general properties and characteristics of the waveguide 121 described above. An inlet port 252 is provided at the left of the waveguide 251 and is joined by a curved coupling section 255 which in turn terminates in an outlet port 257. Disposed adjacent to the coupling section 255 is a dielectric waveguide 258 in ring form, and more specifically in circular form. The ring 258 is spaced from the coupling section 255 to provide therebetween a coupling region 254, the spacing between the waveguides in the coupling region 254 being like that in the coupling region 234 described above. The mean circumference of the ring 258 is at least 10 guide wavelengths at the frequency of electromagnetic energy coupled thereto. Furthermore, the curved coupling section 252 has a radius of curvature having a center that is identical to that of the radius of curvature of the ring 258. When the mean periphery or circumference of the ring waveguide 258 is an integral multiple of the guide wavelength of the energy inserted in the inlet port 252, the filter 250 rejects and blocks passage of energy from the inlet port 252 to the outlet port 257. When the mean periphery or circumference of the ring waveguide 258 is other than an integral multiple of the guide wavelength of the energy inserted in the inlet port 252, the energy is transmitted to the outlet port 257.

Referring to FIG. 20 of the drawings, there is illustrated an insular waveguide bandpass ring resonator filter made in accordance with and embodying the principles of the present invention, the filter being generally designated by the numeral 260. The filter 260 is comprised of three lengths of dielectric waveguide having a common image plane provided by the base plate 101 which on the top surface 102 thereof carries the plastic film 125 secured thereto throughout the contacting surfaces. The three lengths of waveguide are also secured to the plastic film 125 throughout the contacting surfaces. The first dielectric waveguide is designated by the numeral 261 and includes an inlet port 262 which is connected to a first coupling section 265 and terminates to the right at a first outlet port 267. The second dielectric waveguide 271 is provided at the upper right hand end with a termination 272 that may be of the type described above with respect to FIG. 2 and designated by the numeral 127 and 147. The termination 272 is connected to a second curved coupling section 275 that terminates in a second outlet port 277. Disposed between the two dielectric waveguides 261 and 271 is a third dielectric waveguide 280 in the form of a ring, and more specifically a circular ring. The mean circumference of the ring 280 is of at least about 10 guide wavelengths of the energy to be handled by the filter 260, thereby to minimize radiation of electromagnetic energy therefrom. The curved coupling section 265 and 275 have the same center of curvature as does the ring 280, the coupling section 265 cooperating with the ring 280 to form a first coupling region 264, and the coupling section 275 cooperating with the ring 280 to provide a second coupling region 274. The spacing between the waveguides in the coupling regions 264 and 274 is the same as that described above with respect to the coupling region 234 in FIG. 18.

When the mean periphery or circumference of the ring waveguide 280 is an integral multiple of the guide wavelength of the energy in the ring 280, the bandpass filter 260 passes the energy from the first dielectric waveguide 265 through the first coupling region 264 to the ring 280 and through the second coupling region 274 to the second dielectric waveguide 271 and out of the outlet port 277. On the other hand, when the mean periphery or circumference of the ring 280 is other than an integral multiple of the guide wavelength of the energy in the ring 280, all of the energy is coupled to the outlet port 267.

There is illustrated in FIG. 21 of the drawings a modification of the bandpass resonator filters 130 and 260, the filter 360 in FIG. 21 utilizing multiple resonator rings. More particularly, the filter 360 is formed of a plurality of dielectric waveguides 361, 371 380 all of which are mounted upon the base plate 101 which carries on the upper surface 102 thereof the plastic film 125 that is secured to the surface 102 throughout the contacting areas thereof. Likewise, each of the dielectric waveguides 361, 371 and 380 is secured to the plastic film 125 throughout the contacting areas thereof. The first dielectric waveguide 361 is illustrated as being rectilinear in form and including an inlet port 362, a first coupling section 365 and a first outlet port 367. The second dielectric waveguide 371 is also illustrated as being rectilinear in form and has a termination 372 at one end thereof that is like the termination 127 and 147 described above with respect to FIG. 2. The dielectric waveguide 371 also has a second coupling section 375 and a second outlet port 377. Disposed between the dielectric waveguides 361 and 371 is a plurality of rings 380 of dielectric waveguides, each ring 380 including parallel straight sections 381 and 382 that are joined at the ends with curved sections 383. Adjacent straight sections 381 and 382 of adjacent ring 380 provide third coupling regions 384. The coupling regions 364, 374 and 384 all have the same configuration and function in the same manner as the coupling region 234 described above with respect to FIG. 18. The circumference or mean periphery of each ring 380 is at least 10 guide wavelengths to prevent radiation from the curved sections 383 thereof.

When the mean periphery of the rings 380 is an integral multiple of the guide wavelength of the energy in the rings 380, the energy is passed through the several coupling regions and out the second outlet port 377. When the mean periphery of the rings 380 is other than an integral multiple of the guide wavelength of the energy in the rings 380, the energy is passed through the dielectric waveguide 361 and out the first outlet port 367. For all structures of the filter 360 containing an even number of rings 380, the locations of the termination 372 and the second output port 377 are as illustrated in FIG. 21. For those structures of the filter 360 containing an odd number of rings 380, the locations of the termination 372 and the second output port 377 are reversed with respect to the positions illustrated in FIG. 21. As compared to the filter 260, the filter 360 achieves greater out-of-band rejection (band pass type) or greater in band rejection (band stop type), and leading and trailing edges of the response are steeper.

While there have been described what are at present considered to be certain preferred embodiments of the invention, it will be understood that various modifications may be made therein, and it is intended to cover in the appended claims all such modifications as fall within the true spirit and scope of the invention.

What is claimed is:

1. A mixer for use in the frequency range from about 1 GHz to about 1,000 GHz comprising a base plate defining a conductive image plane, a housing mounted on said plate and cooperating therewith to define a cavity, a mixer diode mounted within said cavity and having an output coupling therefor extending out of said cavity, an elongated high permittivity dielectric waveguide of finite cross section adjacent to said image plane and extending into said cavity, and a thin film of synthetic organic resin disposed between and secured to both said image plane and said dielectric waveguide and extending laterally thereof, said thin film being low loss in character and having a low permittivity compared with that of said dielectric waveguide, the ratio between the thickness of said thin film and the square root of the cross-sectional area of said dielectric waveguide being in the range from about 0.02 to about 1.0, the end of said dielectric waveguide extending into said cavity being tapered toward said diode to provide impedance matching and mode transformation of the energy transmitted between said cavity and said dielectric waveguide.

2. The mixer set forth in claim 1, wherein said mixer diode is of the Schottky-barrier type.

3. The mixer set forth in claim 1, wherein said output coupling extends outwardly through said base plate and terminates in a coaxial transmission line.

4. The mixer set forth in claim 1, wherein said cavity has a tuning short therein shiftable toward and away from said diode for impedance matching purposes.

5. The mixer set forth in claim 1, wherein the end of said dielectric waveguide extending into said cavity is tapered in a direction normal to said image plane.

6. The mixer set forth in claim 1, wherein the end of said dielectric waveguide extending into said cavity is disposed substantially normal to the longitudinal axis of said diode.

7. A balanced mixer for use in the frequency range from about 1 GHz to about 1,000 GHz comprising a base plate defining a conductive image plane, a housing mounted on said plate and cooperating therewith to define first and second cavities, first and second mixer diodes mounted respectively within said first and second cavities and each having an output coupling therefor extending out of the respective cavities, first and second elongated high permittivity dielectric waveguides of finite cross section adjacent to said image plane, and a thin film of synthetic organic resin disposed between and secured to both said image plane and said dielectric waveguide and extending laterally thereof, said thin film being low loss in character and having a low permittivity compared with that of said dielectric waveguide, the ratio between the thickness of said thin film and the square root of the cross-sectional area of said dielectric waveguide being in the range from about 0.02 to about 1.0, said first and second dielectric waveguides each having a first section extending respectively into said first and second cavities and each being tapered toward the associated diode to provide impedance matching and mode transformation of the energy transmitted between said cavities and said dielectric waveguides, said first and second dielectric waveguides having second sections disposed outside of said housing and disposed adjacent to each other to provide a coupling region therebetween.

8. The balanced mixer set forth in claim 7, wherein said second sections of said dielectric waveguide provides a hybrid coupler resulting in phase quadrature shift between the input to said balanced mixer.

9. The balanced mixer set forth in claim 7, wherein said output couplings for said mixer diodes extend outwardly through said base plate and are coupled to each other and to a common coaxial transmission line.

10. The balanced mixer set forth in claim 7, wherein each of said cavities has a tuning short therein movable toward and away from the associated diode for impedance matching purposes.

11. A receiver module including a mode launcher and a band pass filter and a local oscillator and a balanced mixer for use in the frequency range of about 1 GHz to about 1,000 GHz comprising a base plate defining a conductive image plane and a plurality of elongated high permittivity dielectric waveguides of finite cross section adjacent to said conductive image plane and interconnecting said mode launcher and said band pass filter and said local oscillator and said mixer, a thin film of synthetic organic resin disposed between and secured to said conductive image plane and said plurality of dielectric waveguides and extending laterally thereof, said thin film being low loss in character and having a low permittivity compared with that of said dielectric waveguides, the ratio of the thickness of said thin film and the square root of the cross-sectional area of said dielectric waveguides being in the range from about 0.02 to about 1.0, a launcher housing having one end coupled to a first one of said dielectric waveguides and having structure at the other end for coupling to one end of a metal waveguide, said launcher housing including regions providing impedance reduction and mode transformation of the energy transmitted thereby, the other end of said first dielectric waveguide being terminated, a second dielectric waveguide in ring form and disposed adjacent to an intermediate portion of said first dielectric waveguide to provide a first coupling region therebetween, a third dielectric waveguide having a section adjacent to said second dielectric waveguide and providing a second coupling region therebetween, said second waveguide having a mean periphery that is an integral multiple of the wavelength guide of the energy therein so that the adjacent sections of said first and third dielectric waveguides form therewith a band pass filter, a mixer housing mounted on said base plate and cooperating therewith to provide first and second cavities, first and second mixer diodes respectively mounted within said first and second cavities and each having an output coupling therefor extending out of the associated cavity, one end of said third dielectric waveguide being terminated and the other end of said dielectric waveguide extending into said first mixer cavity, an oscillator housing mounted on said base plate and cooperating therewith to define a resonant cavity, an IMPATT diode mounted within said resonant cavity and having a bias connection therefor extending from said resonant cavity, a fourth dielectric waveguide having one end thereof extending into resonant cavity and the other end thereof extending into said mixer cavity, the ends of said third and fourth dielectric waveguides extending into said corresponding cavities being tapered toward the associated diodes and the end of said fourth dielectric waveguide extending into said resonant cavity being tapered toward said IMPATT diode all to provide impedance matching and mode transformation of the energy transmitted by said third and fourth dielectric waveguides, sections of said third and fourth dielectric waveguides intermediate to the ends thereof and being disposed closely together and arranged symmetrically to provide coupling region for a quadrature coupler for the electromagnetic energy coupled to said balanced mixer.

* * * * *

UNITED STATES PATENT AND TRADEMARK OFFICE
CERTIFICATE OF CORRECTION

PATENT NO. : 4,072,902
DATED : February 7, 1978
INVENTOR(S) : Robert M. Knox and Peter P. Toulios It is certified that error appears in the above-identified patent and that said Letters Patent are hereby corrected as shown below:

[73] Assignee "Epsilon Lambda Electronics Corporation" should be
--Epsilon Lambda Electronics Corp.--.
Column 4, line 2, "opertion" should be --operation--.
Column 6, line 19, "modular" should be --module--;

Column 11, line 28, "as" should be --at--.
Column 13, line 31, "in" should be --line--.
Column 14, line 9, "GHZ" should be --GHz--;
line 16, "in" should be --is--.
Column 18, line 21, after "371" insert --and--.

Signed and Sealed this

Twentieth Day of June 1978

[SEAL]

Attest:

RUTH C. MASON
Attesting Officer

DONALD W. BANNER
Commissioner of Patents and Trademarks